United States Patent
Sakemi

(10) Patent No.: US 8,557,630 B2
(45) Date of Patent: Oct. 15, 2013

(54) ELECTRONIC COMPONENT MOUNTING METHOD AND ELECTRONIC COMPONENT MOUNT STRUCTURE

(75) Inventor: Shoji Sakemi, Yamanashi (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/201,084

(22) PCT Filed: May 14, 2010

(86) PCT No.: PCT/JP2010/003288
§ 371 (c)(1),
(2), (4) Date: Aug. 11, 2011

(87) PCT Pub. No.: WO2010/134306
PCT Pub. Date: Nov. 25, 2010

(65) Prior Publication Data
US 2012/0052633 A1 Mar. 1, 2012

(30) Foreign Application Priority Data

May 19, 2009 (JP) .................................. 2009-120581

(51) Int. Cl.
*H01L 21/00* (2006.01)
(52) U.S. Cl.
USPC .......................................... 438/106; 257/737
(58) Field of Classification Search
USPC ............................ 257/737, E21.509; 438/106
See application file for complete search history.

(56) References Cited

U.S. PATENT DOCUMENTS 4,884,335 A * 12/1989 McCoy et al. .................... 29/839
5,250,848 A * 10/1993 Christie et al. ................ 257/778

(Continued)

FOREIGN PATENT DOCUMENTS

CN 1132931 A 10/1996
JP 08-186156 A 7/1996

(Continued)

OTHER PUBLICATIONS

Chinese Office Action for Application No. 201080011226.1 dated Jan. 4, 2013.
International Search Report for PCT/JP2010/003288 dated Jul. 20, 2010.

*Primary Examiner* — Jarrett Stark
*Assistant Examiner* — John M Parker
(74) *Attorney, Agent, or Firm* — Pearne & Gordon LLP

(57) ABSTRACT

A challenge to be met by the present invention is to provide an electronic component mounting method and an electronic component mount structure that make it possible to assure bonding strength for an electronic component whose underside is provided with bumps.
In electronic component mounting operation during which an electronic component (6) whose underside is provided with bumps (7) with solder is mounted on a substrate (1), a solder bonding material (3) including solder particles contained in a first thermosetting resin is used for bonding the bumps (7) to an electrode (2) formed on the substrate (1), thereby forming a solder bonding area (7*) where the solder particles and the bumps (7) are fused and solidified and a first resin reinforcement area (3a*) that reinforces the solder bonding area (7*). Further, an adhesive (4) containing as a principal component a second thermosetting resin not including solder particles is used for fixing an outer edge (6a) of the electronic component (6) to reinforcement points set on the substrate (1). Even when the solder bonding material (3) and the bonding agent (4) are blended together, normal thermal curing of the thermosetting resin is not hindered. Bonding strength can thereby be assured for the electronic component (6) whose underside is provided with the bumps (7).

7 Claims, 3 Drawing Sheets

(56) References Cited

U.S. PATENT DOCUMENTS

| | | | |
|---|---|---|---|
| 5,684,677 A | * | 11/1997 | Uchida et al. ............. 361/770 |
| 7,784,671 B2 | * | 8/2010 | Sakaguchi et al. ....... 228/180.22 |
| 2007/0035021 A1 | * | 2/2007 | Suzuki et al. ............. 257/737 |
| 2008/0303145 A1 | | 12/2008 | Takizawa et al. |

FOREIGN PATENT DOCUMENTS

| | | |
|---|---|---|
| JP | 10-092876 A | 4/1998 |
| JP | 2005-026502 A | 1/2005 |
| JP | 2008-300538 A | 12/2008 |

* cited by examiner

ELECTRONIC COMPONENT MOUNTING METHOD AND ELECTRONIC COMPONENT MOUNT STRUCTURE

TECHNICAL FIELD

The present invention relates to an electronic component mounting method for mounting on a substrate electronic components whose undersides are provided with bumps, as well as to an electronic component mount structure formed by means of the electronic component mounting method.

BACKGROUND ART

A solder bonding method has widely been used as a method for mounting electronic components on a substrate. Connection electrodes, such as bumps, provided on electronic components are solder-bonded to electrodes on a substrate, thereby establishing electrical conductivity between the electronic components and the substrate. Further, the thus-mounted electronic components are retained on the substrate by means of solder joints. When external force, such as thermal stress stemming from a heat cycle, acts on the electronic components in an operating state after mounting of the components, deficient strength is provided by only the solder joints. For this reason, the electronic components are bonded to the substrate through use of a reinforcement resin and also by means of solder bonding, thereby reinforcing retaining force originating from the solder joints (see; for instance, Patent Document 1).

In an example described in connection with the Patent Document, solder joints are bonded by means of cream solder (solder paste) in a mount surface block in which a semiconductor package whose underside has a plurality of solder joints is mounted on a printed wiring board. Further, some of the solder joints situated along outer edges are locally reinforced by means of reinforcing material including a thermosetting resin. Specifically, in the related art, there have been used two types of bonding materials that differ from each other in terms of a component composition system; namely, flux-containing cream solder used for solder-bonding connection electrodes, such as bumps, to electrodes on a substrate and a reinforcement material for fixing a component body, such as a semiconductor package, to the substrate in a reinforcing manner.

RELATED ART DOCUMENT

Patent Document

Patent Document 1: JP-A-2008-300538

DISCLOSURE OF THE INVENTION

Problem that the Invention is to Solve

However, recent increasing miniaturization of electronic components causes the following defects when the bonding materials differing from each other in terms of a component composition system are mixedly used on occasion of mounting of the electronic components. Specifically, when small components are objects, it has become difficult to apply a reinforcement material that contains a thermosetting resin as a principal component over the substrate without contacting cream solder fed over a substrate by means of a technique, such as printing, to bond bumps provided on undersides of electronic components. For these reasons, the reinforcement material is blended with the flux component in the cream solder during reflow soldering, which hinders normal thermosetting of the thermosetting resin, to thus result in a failure to yield a sufficient reinforcement effect of the reinforcement material. As mentioned above, the related-art electronic component mounting operation targeted for electronic components whose undersides are provided with bumps is fraught with a failure to yield a reinforcement effect of the reinforcing material and encounters difficulty in assuring bonding strength.

Accordingly, the present invention aims at providing an electronic component mounting method and an electronic component mount structure that make it possible to assure bonding strength for an electronic component whose underside is provided with bumps.

Means for Solving the Problem

An electronic component mounting method of the present invention is an electronic component mounting method for mounting an electronic component whose underside has bumps on a substrate, comprising: a bonding material feed step for feeding a solder bonding material including solder particles contained in a first thermosetting resin to an electrode formed on the substrate; an adhesive application step for applying an adhesive including as a principal component a second thermosetting resin, which does not contain solder particles, to a plurality of reinforcement points set at position corresponding to an outer edge of the electronic component on the substrate; a component mounting step for mounting the electronic component on the substrate that is fed with the solder bonding material and applied with the adhesive, landing the bumps on the electrode by way of the solder bonding material, and bringing the outer edge of the electronic component into contact with the adhesive; and a heat bonding step for heating the substrate having undergone processing pertaining to the component mounting step, to thus fuse and solidify the solder particles and thereby form a solder bonding area for solder-bonding the bumps to the electrode, thermally curing the first thermosetting resin to thus form a first resin reinforcement area for reinforcing the solder bonding area, and thermally curing the second thermosetting resin to thus form a second resin reinforcement area for fixing the outer edge of the electronic component to the reinforcement points on the substrate.

An electronic component mount structure of the present invention is an electronic component mount structure in which an electronic component whose underside is provided with bumps is mounted on a substrate by use of a solder bonding material containing solder particles included in a first thermosetting resin and an adhesive containing as a principal component a second thermosetting resin not including solder particles, the structure comprising: a solder bonding area that is made by fusing and solidifying the solder particles and that solder-bonds the bumps to an electrode formed on the substrate; a first resin reinforcement area that is made by thermally curing the first thermosetting resin and that reinforces the solder bonding area; and a second resin reinforcement area that is formed by thermally curing the second thermosetting resin and that fixes an outer edge of the electronic component to reinforcement points set on the substrate.

Advantage of the Invention

According to the present invention, in connection with electronic component mounting operation for mounting on a substrate an electronic component whose underside is provided with bumps, a solder bonding material including solder particles contained in a first thermosetting resin is used for bonding the bumps to an electrode formed on a substrate. Further, an adhesive containing as a principal component a second thermosetting resin not including solder particles is used for fixing the outer edge of the electronic component to reinforcement points on the substrate. As a result, even when the solder bonding material and the adhesive are blended together, normal thermal curing of the thermosetting resin is not hindered, so that bonding strength can be assured for an electronic component whose underside is provided with bumps.

EMBODIMENT FOR IMPLEMENTING THE INVENTION

Figure 1:
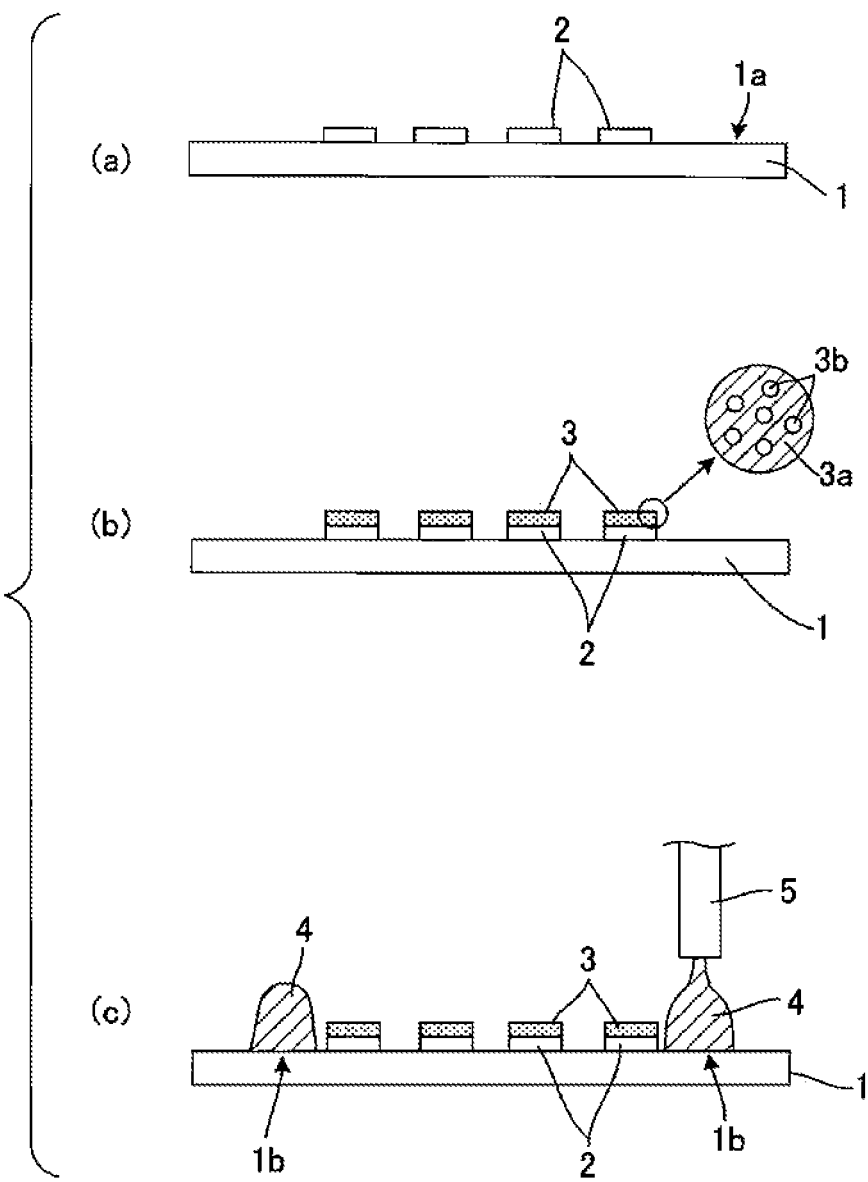
FIGS. 1(a) to (c) are explanatory views of steps of an electronic component mounting method of an embodiment of the present invention.

An embodiment of the present invention is now described by reference to the drawings. In FIG. 1(a), a plurality of electrodes 2 for use in bonding electronic components are formed on an upper surface 1a of a substrate 1. As shown in FIG. 1(b), a solder bonding material 3 including solder particles 3b contained in a first thermosetting resin 3a is fed to each of the electrodes 2 by means of a technique, such as a screen printing technique and a dispensing technique (a bonding material feed step).

As shown in FIG. 1(c), a plurality of reinforcement points 1b are situated on either end of a row of electrodes 2 on the substrate 1 and are set at locations corresponding to outer edges of an electronic component. The reinforcement points 1b are applied with an adhesive 4 containing as a principal component a second thermosetting resin not containing solder particles (an adhesive application step). At this time, since the position for application of the adhesive 4 is close to the electrode 2 situated at the outermost edge, there may arise a case where the adhesive will contact the solder bonding material 3 previously fed onto the electrodes 2 during application operation of a dispenser 5, to thus become partially blended. In the present embodiment, with a view toward preventing occurrence of such a failure, a composition of the first thermosetting resin 3a making up the solder bonding material 3 is made analogous to a composition of the second thermosetting resin making up the adhesive 4, thereby preventing occurrence of hindrance to thermosetting even when the first thermosetting resin and the second thermosetting resin are blended with each other.

The composition of the resin used for the first thermosetting resin 3a and the second thermosetting resin are now described. First, what is used as a base resin of the thermosetting resin includes epoxy resins, like a bisphenol diglycidyl ether epoxy resin, a glycyl amine epoxy resin, a long chain aliphatic diglycidyl ether epoxy resin, and a glycyl ester epoxy resin. Further, a curing agent used for curing the base resin includes amines (aliphatic amines and alicyclic amines), anhydrides (aliphatic anhydrides and alicyclic anhydrides), imidazoles, hydrazides, a dimethyl urea, a dicyandiamide, and the like.

A fluxing material, a monomer, and a low molecular weight compound are used as a dilution agent. Any of a metallic oxide powder, such as silicate, alumina, and calcium carbonate; an organic powder, such as rubber and plastics; and metallic powder, such as solder, copper, and silver, are selected as a filler that is to act as a solid additive, according to an application. A gelling agent, a thermosetting resin like xylene and rhodin, an ion trap agent, a coloring agent, a coupling agent, a surface activation agent, and the like, are selected according to a required characteristic. In addition to the epoxy resin, an acrylic resin, an urethane resin, a phenol resin, and the like, can also be used as the thermosetting resin.

Specific example compounding employed when the solder bonding material 3 and the adhesive 4 are used in combination is now described. First example compounding is now described. The solder bonding material 3 is cream solder made by letting the first thermosetting resin 3a, which is a viscous body, contain the solder particles 3b. Solder particles formed by making solder, like Sn-based solder, into particulate, is used as the solder particles 3b. There is used as the first thermosetting resin 3a a compound that contains a bisphenol diglycidyl ether epoxy resin as a base resin, (alicyclic) anhydride as a curing agent, an epoxy monomer as a diluent, and as an additive a gelling agent and an organic acid for imparting an activation property to eliminate an oxide film from a solder surface. Specifically, the first thermosetting resin 3a also exhibits a feature of flux contained in ordinary cream solder.

Like the solder bonding material 3, the adhesive 4 contains a bisphenol diglycidyl ether epoxy resin as a base resin, a resultant of addition of (10% of) imidazole to (alicyclic) (90% of) anhydride as a curing agent, an epoxy monomer as a diluent, a metal oxide powder like silicate and an organic powder like rubber as a solid additive filler, and a gelling agent, a coloring agent, and an ion trap agent as an additive. In the first example compounding, both the solder bonding material 3 and the adhesive 4 contain a bisphenol diglycidyl ether epoxy resin as a base resin and have the same composition. In relation to the curing agent, the solder bonding material 3 and the adhesive 4 commonly contain 90% of (alicyclic) anhydride.

An explanation is now given to second example compounding. There is used as the first thermosetting resin 3a a compound that contains a bisphenol diglycidyl ether epoxy resin as a base resin, hydrazides as a curing agent, an epoxy monomer as a diluent, and as an additive a gelling agent, a thermosetting resin like rhodin for imparting an activation property, and an organic acid. Addition of the thermosetting resin makes it possible to soften a resin reinforcement block by heating when a repair is required after bonding. Thus, there is yielded an advantage of the ability to easily remove an electronic component.

Like the solder bonding material 3, the adhesive 4 contains a mixture consisting of (70% of) a bisphenol diglycidyl ether epoxy resin and (30% of) long chain aliphatic diglycidyl ether epoxy as a base resin, a resultant of addition of imidazoles to (alicyclic) anhydride as a curing agent, an epoxy monomer as a diluent, a metal oxide powder like silicate and an organic powder like rubber as a solid additive filler, and a gelling agent and a coloring agent as an additive. In the second example compounding, both the solder bonding material 3 and the adhesive 4 commonly contain (70% of) a bisphenol diglycidyl ether epoxy resin as a base resin. Further, in relation to the curing agent, the solder bonding material 3 and the adhesive 4 commonly contain 100% of hydrazides.

In both the first example compounding and the second example compounding and in connection with component compositions of two types of resins; namely, the first thermosetting resin making up the solder bonding material 3 and the second thermosetting resin making up the adhesive 4, the base resin and the curing agent contained in the two types of resins each have a composition containing 50% or more of a common component. As mentioned above, in connection with component compositions of two types of resins; namely, the first thermosetting resin and the second thermosetting resin, the base resin and the curing agent each contain 50% or more of a common component. As a result, even when the resins contain different components other than the base resin and the curing agent and when the two types of resins are blended, occurrence of normal thermosetting reaction is not hindered.

Figure 2:
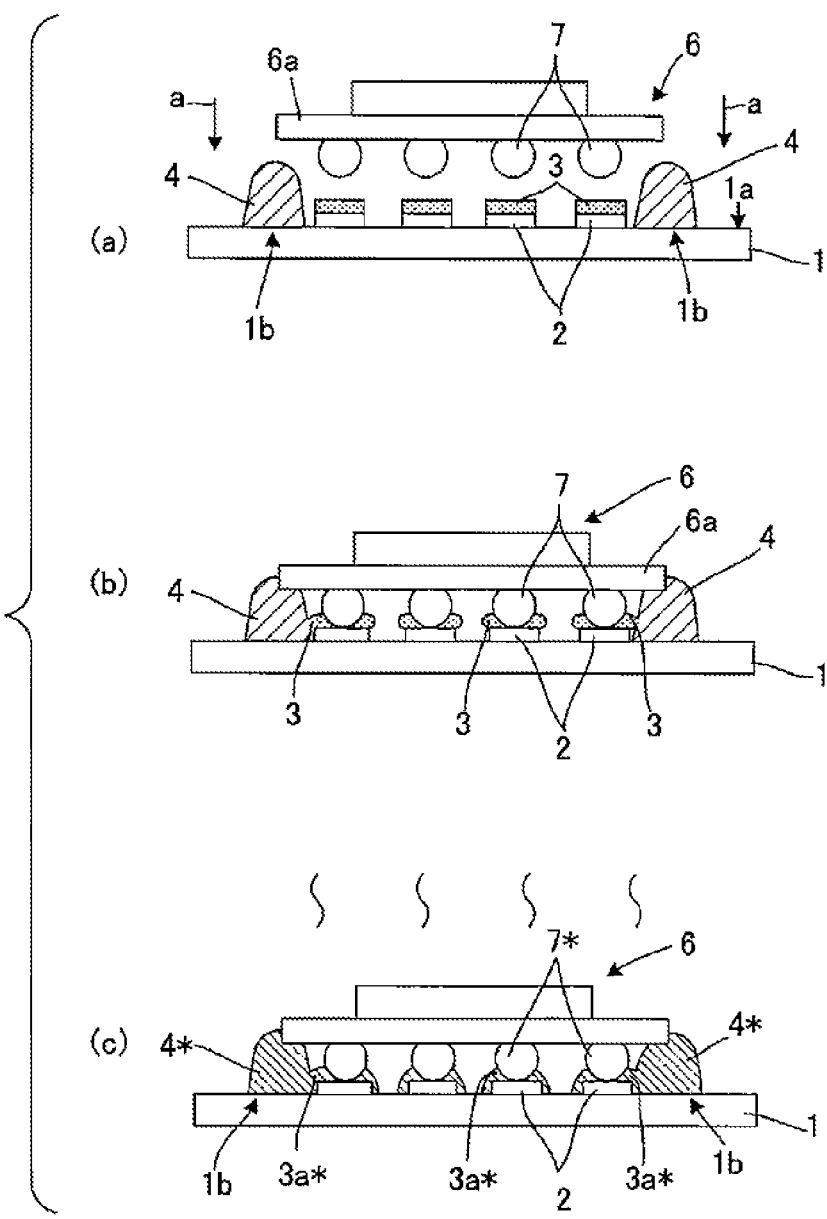
FIGS. 2(a) to (c) are explanatory views of steps of the electronic component mounting method of the embodiment of the present invention.

As shown in FIG. 2(a), the solder bonding material 3 is fed to the electrodes 2, and an electronic component 6 is mounted on the substrate 1 having the adhesive 4 applied over the reinforcement points 1b on the upper surface 1a. The electronic component 6 is an electronic component having bumps, like a BGA (Ball Grid Array), in which bumps 7 for external connection are formed from solder on an underside. During mounting of the electronic component 6, the electronic component 6 is lowered (as indicated by an arrow "a") to the substrate 1 with the bumps 7 aligned to corresponding electrodes 2. As shown in FIG. 2(b), the bumps 7 are landed on their corresponding electrodes 2 by way of the solder bonding material 3, and the adhesive 4 is brought into contact with an outer edge 6a of the electronic component 6 (a component mounting step).

Subsequently, the substrate 1 having undergone steping pertaining to the component mounting step is delivered to a reflow apparatus, where the substrate is heated by means of a predetermined temperature profile. As shown in FIG. 2(c), the solder particles 3b are fused and solidified along with the bumps 7, by means of heating, thereby forming solder bonding areas 7* that are used for solder bonding the bumps 7 to their corresponding electrodes 2. Simultaneously, the first thermosetting resin 3a in the solder bonding material 3 is thermally cured, thereby forming first resin reinforcement areas 3a* that reinforce the solder bonding areas 7* from their neighborhoods. Moreover, the second thermosetting resin making up the adhesive 4 is thermally cured by means of heating, thereby forming second resin reinforcement areas 4* that are used for fixedly bonding the outer edge 6a of the electronic component 6 to the reinforcement points 1b of the substrate 1 (a heat bonding step).

Figure 3:
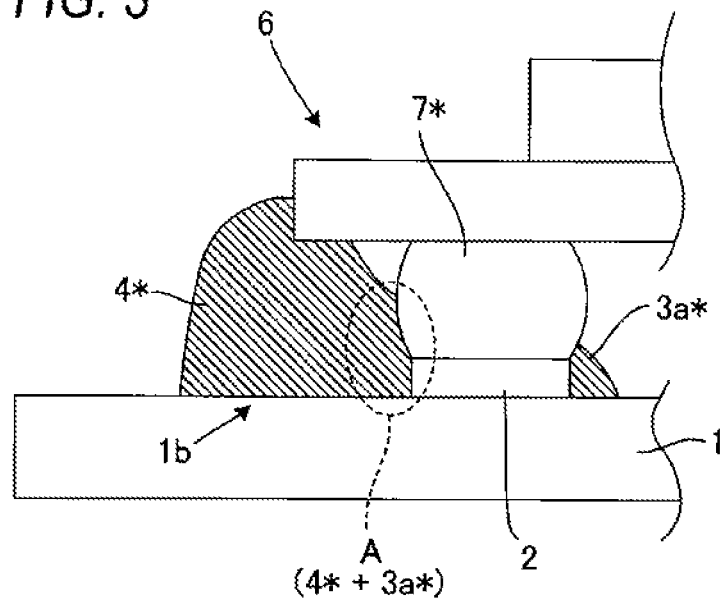
FIG. 3 is a fragmentary cross sectional view of an electionic component mount structure of the embodiment of the present invention.

FIG. 3 shows a fragmentary cross sectional view of an electronic component mount structure in which the electronic component 6 having the bumps 7 provided on an underside thereof is mounted on the substrate 1 by use of a solder bonding material made by letting the first thermosetting resin include solder particles and an adhesive containing as a base resin the second thermosetting resin not including solder particles. The cross sectional view shows an area including a bump 7 situated along an outermost edge and in the vicinity of the reinforcement point 1b by means of the adhesive 4, among the plurality of bumps 7 formed on the electronic component 6.

Specifically, the electronic component mount structure comprises the solder bonding areas 7* that are made by means of fusing and solidifying the solder particles 3b along with the bumps 7 and that solder-bonds the bumps 7 to their corresponding electrodes 2 laid on the substrate 1; the first resin reinforcement areas 3a* that are formed by thermally curing the first thermosetting resin 3a in the solder bonding material 3 and that reinforce the solder bonding areas 7*; and the second resin reinforcement areas 4* that are formed by thermally curing the second thermosetting resin making up the adhesive 4 and that fixedly bond the outer edge 6a of the electronic component 6 to the reinforcement points set on the substrate 1.

Of the first resin reinforcement area 3a* that reinforces the solder bonding area 7* from its surrounding, a portion of the first resin reinforcement area in an area A (indicated by a wavy frame) located in close proximity to the resin reinforcement area 4* remains in contact with the adhesive 4 later applied, to thus be partially mixed. In the area A, continuity exists between the second resin reinforcement area 4* and the first resin reinforcement area 3a*.

In connection with component compositions of two types of resins; namely, the first thermosetting resin 3a making up the solder bonding material 3 and the second thermosetting resin making up the adhesive 4, the base resin and the curing agent contained in the two types of resins each have a composition containing 50% or more of a common component in the electronic component mount structure. Hence, the second resin reinforcement areas 4* and the first resin reinforcement areas 3a* do not hinder thermosetting action in the area A and thermally cured while previously-mixed components remain in a substantially-uniformly-solid-dispersed state. The reinforcement effect yielded by the second resin reinforcement areas 4* that fix the outer edge 6a of the electronic component 6 to the reinforcement point 1b set on the substrate 1 is not hindered by the thermal curing action. Therefore, it is possible to solve the drawback of the related art that uses flux-containing cream solder for solder bonding the bumps to the electrodes. Namely, it is possible to prevent deterioration of the reinforcement effect, which would otherwise be caused when thermal curing reaction is hindered by mixing of flux with the thermosetting resin.

Figure 4:
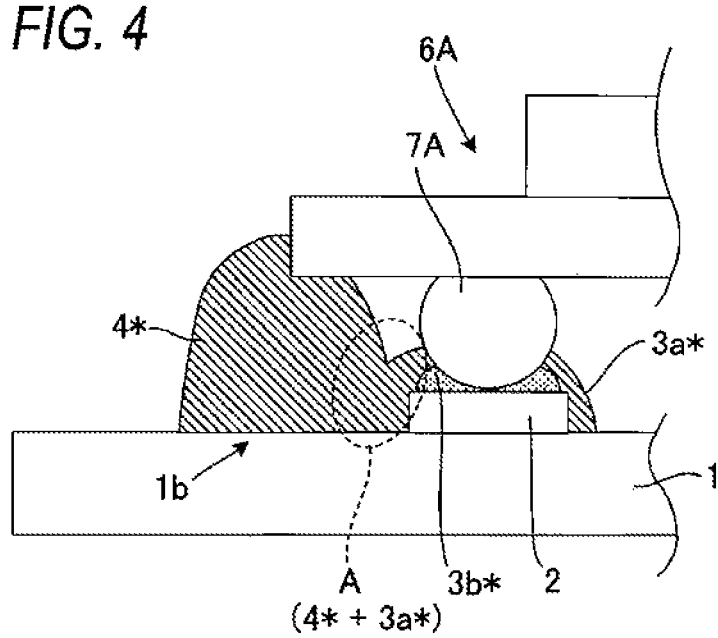
FIG. 4 is a fragmentary cross sectional view of the electronic component mount structure of the embodiment of the present invention.

The embodiment illustrates the example in which the bumps 7 made of solder are formed as the electronic component 6 with bumps. However, the material of the bumps employed in the invention is not limited to solder. The present invention can also apply to an electronic component with bumps in which bumps are made of metal other than solder, like gold (Au). Specifically, an electronic component mount structure, such as that shown in FIG. 4, is formed in connection with electronic component mounting operation for mounting an electronic component 6A having metal bumps 7A on the substrate 1 by use of the solder bonding material 3 and the adhesive 4 that have the aforementioned configurations.

In the embodiment, solder particles 3b in the solder bonding material 3 are fused and solidified, thereby forming a solder bond area 3b* that solder-bonds the bump 7A to the electrode 2 laid on the substrate 1. The first resin reinforcement area 3a* for reinforcing the solder bond area 3b* is formed by thermally curing the first thermosetting resin 3a. Likewise, there is formed the second resin reinforcement area 4* for fixing the outer edge 6a of the electronic component 6A to the reinforcement point set on the substrate 1 by means of thermally curing the second thermosetting resin.

Even in the present embodiment, the second resin reinforcement area 4* and the first resin reinforcement area 3a* each do not hinder occurrence of thermal curing in the area A, as in the case of the embodiment shown in FIG. 3. Components previously mixed in the reinforcement areas are thermally cured while remaining in a substantially-uniform solid-dispersed state. A reinforcement effect of the second resin reinforcement area 4* that fixes the outer edge 6a of the electronic component 6 to the reinforcement point set on the substrate 1 is not hindered by the thermal curing action.

Although the present invention has been described in detail and by reference to the specific embodiment, it is manifest to those skilled in the art that various alterations or modifications can be made to the present invention without departing the spirit and scope of the invention.

The present patent application is based on Japanese Patent Application (JP-A-2009-120581) filed on May 19, 2009, the entire subject matter of which is incorporated herein by reference.

INDUSTRIAL APPLICABILITY

An electronic component mounting method and an electronic component mount structure of the invention yield an advantage of the ability to assure bonding strength for an electronic component whose underside is provided with bumps and are useful in a field in which an electronic component with bumps, such as a BGA, is subjected to surface mounting.

DESCRIPTIONS OF REFERENCE NUMERALS AND SYMBOLS

1 SUBSTRATE
2 ELECTRODE
3 SOLDER BONDING MATERIAL
3a FIRST THERMOSETTING RESIN
3b SOLDER PARTICLE
4 ADHESIVE
6, 6A ELECTRONIC COMPONENT
6a OUTER EDGE
7, 7A BUMP

The invention claimed is:

1. An electronic component mounting method for mounting an electronic component whose underside has bumps on a substrate, comprising:
a bonding material feed step for feeding a solder bonding material including solder particles contained in a first thermosetting resin to an electrode formed on the substrate;
an adhesive application step for applying an adhesive including as a principal component a second thermosetting resin, which does not contain solder particles, to a plurality of reinforcement points set at position corresponding to an outer edge of the electronic component on the substrate;
a component mounting step for mounting the electronic component on the substrate that is fed with the solder bonding material and applied with the adhesive, landing the bumps on the electrode by way of the solder bonding material, and bringing the outer edge of the electronic component into contact with the adhesive; and
a heat bonding step for heating the substrate having undergone processing pertaining to the component mounting step, to thus fuse and solidify the solder particles and thereby form a solder bonding area for solder-bonding the bumps to the electrode, thermally curing the first thermosetting resin to thus form a first resin reinforcement area for reinforcing the solder bonding area, and thermally curing the second thermosetting resin to thus form a second resin reinforcement area for fixing the outer edge of the electronic component to the reinforcement points on the substrate,
wherein a base resin and a curing agent contained in the first thermosetting resin and the second thermosetting resin, each contain 50% or more of a common component in connection with component compositions of the first thermosetting resin and the second thermosetting resin.

2. The electronic component mounting method according to claim 1, wherein the first thermosetting resin and the second thermosetting resin contain at least one common thermosetting resin component in connection with component compositions of the first thermosetting resin and the second thermosetting resin.

3. The electronic component mounting method according to claim 1, wherein the first thermosetting resin and the second thermosetting resin contain the same type of a thermosetting resin component in connection with component compositions of the first thermosetting resin and the second thermosetting resin.

4. The electronic component mounting method according to claim 1, wherein the solder particles are dispersed in the first thermosetting resin.

5. The electronic component mounting method according to claim 1, wherein in the heat bonding step the first resin reinforcement area is formed so that the first resin reinforcement area surrounds an outer surface of the solder bonding area.

6. An electronic component mounting method for mounting an electronic component whose underside has bumps on a substrate, comprising:
a bonding material feed step for feeding a solder bonding material contained in a first thermosetting resin to an electrode formed on the substrate;
an adhesive application step for applying an adhesive including as a principal component a second thermosetting resin to a plurality of reinforcement points set at position corresponding to an outer edge of the electronic component on the substrate;
a component mounting step for mounting the electronic component on the substrate that is fed with the solder bonding material and applied with the adhesive, landing the bumps on the electrode by way of the solder bonding material, and bringing the outer edge of the electronic component into contact with the adhesive; and
a heat bonding step for heating the substrate having undergone processing pertaining to the component mounting step, to form a solder bonding area for solder-bonding the bumps to the electrode, thermally curing the first thermosetting resin to thus form a first resin reinforcement area for reinforcing the solder bonding area, and thermally curing the second thermosetting resin to thus form a second resin reinforcement area for fixing the outer edge of the electronic component to the reinforcement points on the substrate,
wherein the first thermosetting resin and the second thermosetting resin contain at least one common thermosetting resin component in connection with component compositions of the first thermosetting resin and the second thermosetting resin.

7. The electronic component mounting method according to claim 6, wherein in the heat bonding step the first resin reinforcement area is formed so that the first resin reinforcement area surrounds an outer surface of the solder bonding area.

* * * * *